United States Patent
Vinet et al.

(10) Patent No.: US 9,396,984 B2
(45) Date of Patent: Jul. 19, 2016

(54) METHOD OF PRODUCING A MICROELECTRONIC DEVICE IN A MONOCRYSTALLINE SEMICONDUCTOR SUBSTRATE WITH ISOLATION TRENCHES PARTIALLY FORMED UNDER AN ACTIVE REGION

(75) Inventors: Maud Vinet, Rives sur Fure (FR);
Nicolas Loubet, Guilderland, NY (US);
Romain Wacquez, Marseilles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/425,977

(22) PCT Filed: May 9, 2012

(86) PCT No.: PCT/US2012/053767
§ 371 (c)(1),
(2), (4) Date: Jul. 8, 2015

(87) PCT Pub. No.: WO2014/039033
PCT Pub. Date: Mar. 13, 2014

(65) Prior Publication Data
US 2015/0340275 A1    Nov. 26, 2015

(51) Int. Cl.
| | | |
|---|---|---|
| H01L 21/00 | (2006.01) |
| H01L 21/762 | (2006.01) |
| H01L 21/311 | (2006.01) |
| H01L 29/04 | (2006.01) |
| H01L 29/06 | (2006.01) |

(Continued)

(52) U.S. Cl.
CPC ...... *H01L 21/76224* (2013.01); *H01L 21/3065* (2013.01); *H01L 21/31116* (2013.01); *H01L 21/76232* (2013.01); *H01L 21/76283* (2013.01); *H01L 21/823481* (2013.01); *H01L 29/04* (2013.01); *H01L 29/045* (2013.01); *H01L 29/0653* (2013.01)

(58) Field of Classification Search
CPC ............... H01L 21/76224; H01L 21/823481; H01L 21/31116; H01L 29/045; H01L 29/04; H01L 21/76232
See application file for complete search history.

(56) References Cited

U.S. PATENT DOCUMENTS

| | | |
|---|---|---|
| 2002/0001968 A1 | 1/2002 | Lee et al. |
| 2007/0278183 A1 | 12/2007 | Lee et al. |
| 2009/0289291 A1 | 11/2009 | Cheng et al. |

(Continued)

OTHER PUBLICATIONS

U.S. Appl. No. 14/441,354, filed May 7, 2015, Vinet, et al.

(Continued)

*Primary Examiner* — Richard Booth
(74) *Attorney, Agent, or Firm* — Oblon, McClelland, Maier & Neustadt, L.L.P.

(57) ABSTRACT

A method of producing a microelectronic device in a substrate including a first semiconductor layer, a dielectric layer and a second monocrystalline semiconductor layer, the method including: etching a trench through the first semiconductor layer and the dielectric layer, and such that the trench delimits one active region of the microelectronic device; chemical vapor etching the second semiconductor layer, at a level of a bottom wall of the trench, according to at least two crystalline planes of the second semiconductor layer such that an etched part of the second semiconductor layer extends under a part of the active region; filling the trench and the etched part of the second semiconductor layer with a dielectric material.

12 Claims, 5 Drawing Sheets

(51) Int. Cl.
*H01L 21/8234* (2006.01)
*H01L 21/3065* (2006.01)

(56) References Cited

U.S. PATENT DOCUMENTS

2013/0302955 A1  11/2013  Vinet et al.
2014/0061798 A1   3/2014  Vinet et al.
2014/0322767 A1  10/2014  Marchand et al.
2015/0044841 A1   2/2015  Batude et al.
2015/0056734 A1   2/2015  Grenouillet et al.

OTHER PUBLICATIONS

"International Business Machines Corporation; Patent Issued for Method of Fabricating a Deep Trench (DT) Metal-Insulator-Metal (MIM) Capacitor", Trade Journals, URL: http://search.proquest.com/docview/1034581372?accountId=142944, pp. 1-5, (Aug. 29, 2012).

International Search Report Issued Nov. 2, 2012 in PCT/US12/053767 Filed Sep. 5, 2012.

U.S. Appl. No. 14/425,891, filed Mar. 4, 2015, Grenouillet, et al.

METHOD OF PRODUCING A MICROELECTRONIC DEVICE IN A MONOCRYSTALLINE SEMICONDUCTOR SUBSTRATE WITH ISOLATION TRENCHES PARTIALLY FORMED UNDER AN ACTIVE REGION

TECHNICAL FIELD

The invention relates to microelectronic devices fabricated with a monocrystalline semiconductor on insulator type substrate (SOI) and having active regions, or areas or zones, delimited by isolation trenches, for example of STI type ("Shallow Trench Isolation"). The invention is advantageously used for the production of FDSOI (Fully-Depleted SOI) transistors made with UTBB ("Ultra-Thin Body and Box") technology.

BACKGROUND OF THE INVENTION

The fabrication of microelectronic devices, such as transistors, in a monocrystalline SOI substrate comprises the realization of insulation trenches, for example of the STI type, that allow an electrical isolation of the active regions of the devices, made in the same SOI substrate, from each other to be obtained.

The pattern of the isolation trenches made in the substrate is complementary to that of the active regions of the devices. An example of an isolation trench 8 of the STI type is shown in FIG. 1. This trench 8 is made in a monocrystalline SOI substrate 1 comprising a support layer 2, or thick layer, composed of monocrystalline semiconductor (typically of silicon) coated with a dielectric thin layer 4 called BOX (Burried OXide) and a semiconductor thin layer 6, also called surface layer, composed of monocrystalline semiconductor, here of silicon, and wherein the active regions of the devices are intended to be made. In FIG. 1, the isolation trench 8 delimits two active regions 10a and 10b of two transistors intended to be made in the semiconductor thin layer 6. The isolation trench 8, composed of a dielectric material such as $SiO_2$, is made through the entire thicknesses of the semiconductor thin layer 6 and of the dielectric thin layer 4, and through a part of the thickness of the support layer 2.

During the fabrication of the microelectronic devices in the substrate 1, after forming the isolation trench 8, the substrate 1 usually undergoes several steps of cleaning and etching which can damage the insulation trench 8, such as cleaning steps performed with a hydrofluoric acid solution and after a gate etching or prior to silicidation or epitaxy steps. The semiconductor oxide of the isolation trench 8 is attacked by these steps and partially removed, or consumed, both vertically and horizontally (see FIG. 2 onto which the dielectric material of the isolation trench 8 is partially withdrawn). Such degradations of the isolation trench 8 can lead to problems of electrical insulation between the support layer 2 and the semiconductor thin layer 6, especially during the subsequent realization of electrical contacts in the vicinity of the isolation trench 8. In the example shown on FIG. 3, one of the electrical contacts 12 is intended to electrically contact a portion of the active region 10b near the isolation trench 8, this portion corresponding for example to a source or drain region of a transistor made in the active region 10b. However, in current technology nodes, given the short distance between two active regions (equal to about 50 nm in the 20 nm-node technology) which corresponds to the width of the isolation trench, a slight misalignment during the lithography carried out to make the electrical contact 12 can cause a shift of this electrical contact 12 on the isolation trench 8. Such a shift can also be intentional, some electrical contacts being made voluntarily overflowing on the isolation trench 8. However, given the partial withdrawal of $SiO_2$ of the isolation trench 8, this offset can lead to a short circuit between the active region 10b formed in the semiconductor thin layer 6 and the semiconductor of the support layer 2 (on the example of FIG. 3, a part of the electrical contact 12 is placed in a recess formed by the partial removal of the dielectric material of the isolation trench 8, thus short-circuiting the semiconductor thin layer 6 with the support layer 2). Such problem may for example appear during the production of devices made with UTBB technology, like SRAM which comprises many FDSOI transistors.

To solve this problem of degradation of the insulation trenches, a solution shown in FIG. 4 is, when making an isolation trench 15, first to cover the walls (side walls and bottom wall) of the trench with a thin layer 14 (that is a liner) composed of a dielectric material more resistant than the semiconductor oxide used to make the isolation trench 8, for example composed of silicon nitride. The remaining space of the trench is then filled with a semiconductor oxide 16, like $SiO_2$.

The parts of the SiN layer 14 forming the side walls of the isolation trench 15 strengthen the resistance of the isolation trench 15 towards the steps of cleaning and etching.

However, although this solution partially avoids a degradation of the isolation trench during the steps of cleaning and etching, it does not completely eliminate the risk of short circuit described above. Indeed, during the etching of the electrical contacts, it is necessary to etch a thin nitride layer (called "contact etch stop layer"), which will result in the simultaneous etching of the nitride layer 14 and thus destroy the sealing made by the nitride layer 14. In addition, when the layer 14 is composed of a high permittivity dielectric, electrical performance degradations of the devices are observed as a result of an oxygen diffusion occurring through the liner.

BRIEF DESCRIPTION OF THE INVENTION

Thus there is a need to provide a method of producing a microelectronic device comprising at least one active region delimited by an isolation trench which is resistant towards steps which can degrade the material(s) of the isolation trench, which avoids short circuits in the substrate even in case of partial withdrawal of the material(s) of the trench isolation, and which is not limited by the dimensions and the shape of the isolation trench.

For this, one embodiment of the invention proposes a method of producing a microelectronic device in a substrate comprising a first semiconductor layer disposed on a dielectric layer, the dielectric layer being disposed on a second semiconductor layer comprising at least a monocrystalline semiconductor, the method comprising at least the following steps:

etching a trench through the first semiconductor layer and the dielectric layer such that a bottom wall of the trench is formed by a part of the top face of the second semiconductor layer, and such that the trench delimits, in the first semiconductor layer, at least one active region of the microelectronic device, chemical vapor etching of the second semiconductor layer, at the level of the bottom wall of the trench, according to at least two crystalline planes of the second semiconductor layer, one of said two crystalline planes corresponding to a crystalline orientation of the second semiconductor layer, such that an etched part of the second semiconductor layer extends under a part of the active region, filling of the trench and of said etched part of the second semiconductor layer with a dielectric material, forming an isolation trench surrounding the active region and comprising, at the level of the etched part of the second semiconductor layer, at least one portion of the dielectric material extending under a part of the active region.

Thus, the isolation trench comprises, at the level of the support layer of the substrate, that is in the second semiconductor layer, one or more dielectric regions thicker than the rest of the isolation trench and which extend under the active region, for example where there is a risk of short circuit and/or where the thickness of the dielectric material of the isolation trench has no or little impact on the electrical characteristics of the semiconductor device, for example under the regions of source and drain of a transistor which may correspond to the microelectronic device. In the event of partial withdrawal of a part of the dielectric material of the isolation trench, the at least one portion of dielectric material extending under a part of the active region ensure an electrical insulation of the second semiconductor layer towards one or more electrical contacts which may extend beyond over the isolation trench.

Such isolation trench therefore comprises one or more side walls which, at the level of the second semiconductor layer, are not vertically aligned with the active region bounded by the isolation trench.

Compared to a wet etching using TMAH, KOH or $NH_4OH$ as etching agent, or an isotropic plasma etching, a chemical vapor etching enables to have a good etching of the monocrystalline semiconductor of the second semiconductor layer which is against the dielectric layer. Indeed, with a wet etching using TMAH, KOH or $NH_4OH$ as etching agent, the corner of the monocrystalline semiconductor which is against the dielectric layer is not etched due to the capillarity forces next to the wetting surface. Moreover, with an isotropic plasma etching, the corner of the monocrystalline semiconductor which is against the dielectric layer is also not etched due to the plasma difference in the etched cavity. An isotropic plasma etching is also not adapted to make an isolation trench as desired here because the ratio between the vertical etch rating and the lateral etch rating cannot be controlled, leading to a trench with uncontrolled dimensions.

As the chemical vapor etching is carried out on the front face of the second semiconductor layer (that is the face of the second semiconductor layer which is placed against the dielectric layer (BOX) of the substrate), this etching step does not form side walls along a double crystalline plane, for example along a double crystalline plane {111}. The crystalline planes which are etched are controlled and correspond, e.g. for a monocrystalline semiconductor layer with a crystalline orientation {100}, to the crystalline planes {100} and {111}.

This chemical vapor etching also enables to control the ratio between the etching rates of the two etched crystalline planes, that enables to control the ratio between the vertical etch rating and the lateral etch rating through the second semiconductor layer.

This method also enables to obtain a local enlargement of the dielectric of the isolation trench at the level of the second semiconductor layer, which reduces the dependence on the loading factor, i.e. which the dependence on the density of the design realized in the silicon wafer.

The at least one portion of the dielectric material extending under the part of the active region may be in contact with a portion of the dielectric layer disposed under the active region. This configuration improves the insulation obtained with the isolation trench between the two layers of semiconductor.

The chemical vapor etching may be carried out using HCl or $Cl_2$ as etching agent.

The crystalline orientation of the second semiconductor layer may be {100}, and the other of the two etched crystalline planes may be {111}.

The chemical vapor etching step may be carried out such that a ratio between an etching rate of the crystalline plane {111} and an etching rate of the crystalline plane {100} is equal or greater than 0.58. This control of the ratio between the etching rates of the etched crystalline planes may be obtained via the control of the temperature, the pressure and the timing of the chemical vapor etching step.

The chemical vapor etching step may also etch the crystalline plane {311} of the second semiconductor layer. These facets appear because of favorable etching rate ratio between facets.

The first semiconductor layer may comprise a monocrystalline semiconductor. With this configuration, it is possible to realize an active region comprising a monocrystalline semiconductor.

The chemical vapor etching step may be carried out at a temperature between about 600° C. and 950° C., at a pressure between about 10 Pa and $10^5$ Pa, and during a period between about 1 second and 10000 seconds.

The method may further comprises, between the step of etching the trench through the first semiconductor layer and the dielectric layer, and the step of chemical vapor etching of the second semiconductor layer, a step of producing at least one dielectric layer forming side walls of the trench against the dielectric layer and the first semiconductor layer. Such a liner of dielectric material may form the upper part of the side walls of the isolation trench, and can prevent an etching of the first semiconductor layer during the chemical vapor etching step.

The active region may be rectangular in shape and delimited by side walls of the isolation trench extending through the first semiconductor layer, the dielectric layer and a part of the thickness of the second semiconductor layer, and, at the level of said part of the thickness of the second semiconductor layer, the side walls of the isolation trench may be formed by the at least one portion of the dielectric material extending under the part of the active region. In this variant, at the level of the second semiconductor layer, all side walls of the isolation trench may extend beyond under the active region, and be in contact with a portion of the dielectric layer which is placed under the active region. Thus, in this variant, at the level of the second semiconductor layer, none of the side walls of the isolation trench, at the level of the second semiconductor layer, is vertically aligned with the limits of the active region delimited by the part of the isolation trench at the level of the first semiconductor layer.

The method may further comprise, between the step of chemical vapor etching of the second semiconductor layer and the step of filling of the trench and of said etched part of the second semiconductor layer with a dielectric material, a step of etching a second part of the second semiconductor layer, extending the trench deeper in the second semiconductor layer.

The method may further comprise, after the step of filling of the trench and of said etched part of the second semiconductor layer with a dielectric material, a step of producing at least one transistor in the active region, the transistor comprising a gate made on a part of the active region.

BRIEF DESCRIPTION OF THE DRAWINGS

The present invention will be better understood upon reading the description of embodiments given purely indicative and in no way limiting with reference to the accompanying drawings, in which.

Figure 1:
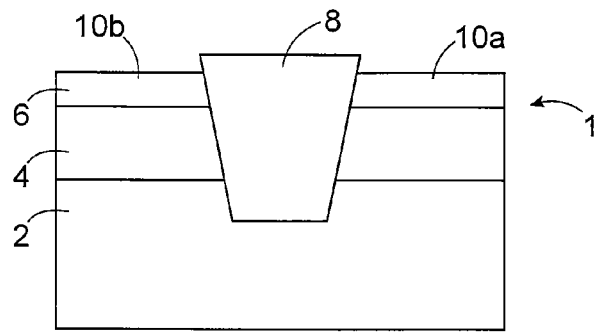
FIGS. 1 to 4 show isolation trenches according to prior art.
Figure 2:
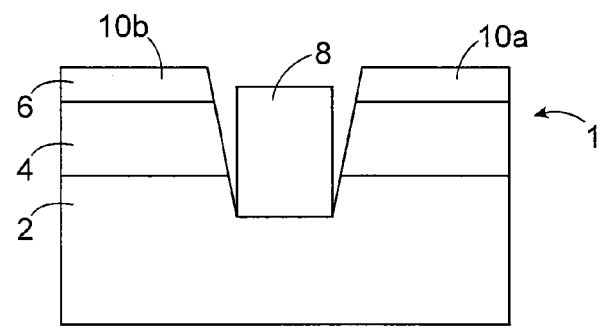
Figure 3:
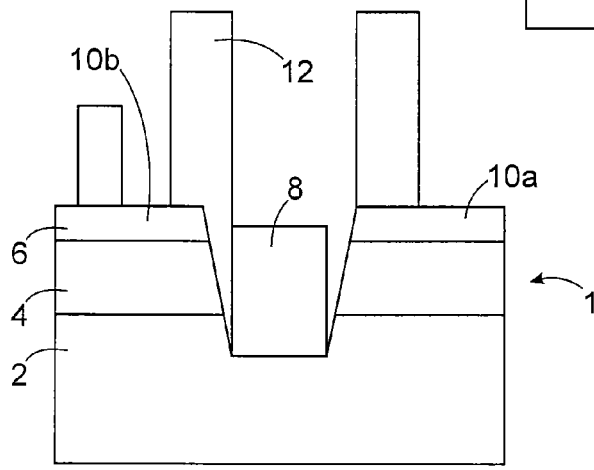
Figure 4:
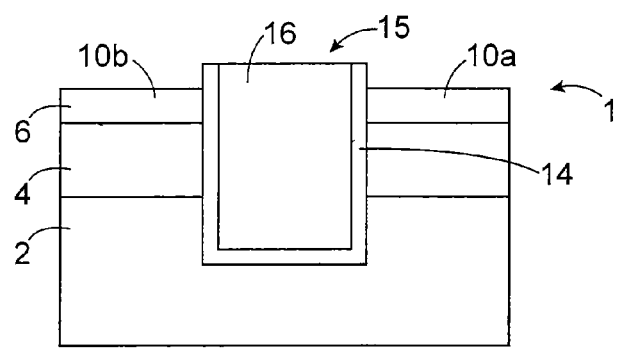
Figure 5:
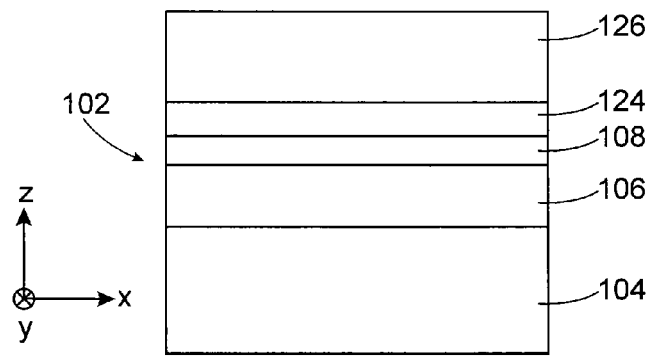
FIGS. 5 to 14 show a microelectronic device produced with a method according to a particular embodiment of the invention.

Identical, similar or equivalent parts of the different figures described hereinafter bear the same numerical references so as to facilitate the transition from one figure to another.

The different parts illustrated in the figures are not necessarily shown using a uniform scale, to make the figures more legible.

The different possibilities (alternatives and embodiments) must be understood as not being mutually exclusive and may be combined with one another.

DETAILED DESCRIPTION OF SPECIFIC EMBODIMENTS

A method for producing a microelectronic device 100, here a FDSOI transistor, according to a first embodiment is now described in relation with FIGS. 5-14.

The device 100 is made from a standard pre-STI stack comprising a monocrystalline SOI substrate 102. The substrate 102 comprises a support layer 104, or thick layer, composed of monocrystalline semiconductor, for example monocrystalline silicon, a dielectric thin layer 106 (BOX), for example composed of $SiO_2$, and a thin layer 108, or surface layer, composed of semiconductor, here monocrystalline silicon. An oxide layer (e.g. $SiO_2$) 124 and a nitride layer (here SiN) 126 are stacked on the substrate 102. The layers of this stack shown in FIG. 5 have for example the following thicknesses:

nitride layer 126: 80 nm, or between around 50 nm and 100 nm,
oxide layer 124: 10 nm, or between around 3 nm and 10 nm,
thin layer of silicon 108: 7 nm,
thin dielectric layer 106: 25 nm,
thick silicon layer 104: 700 µm.

The above thicknesses are given as an indication for a device 100 manufactured using the 20 nm-node UTBB technology. However, these thicknesses may vary, according to the implementation options considered and also the technology node with which the device is made.

The crystalline orientation of the monocrystalline semiconductor of the support layer 104 is {100} and a main crystalline direction, or main direction, of the support layer 104 is <110>. The orientation and the main direction correspond to an observation of the support layer 104 as respect to x axis or y axis shown on FIG. 5, x and y axis following the <110> crystalline direction. If the crystalline direction is different, the facets which will be etched as disclosed below are also different.

Figure 6A:
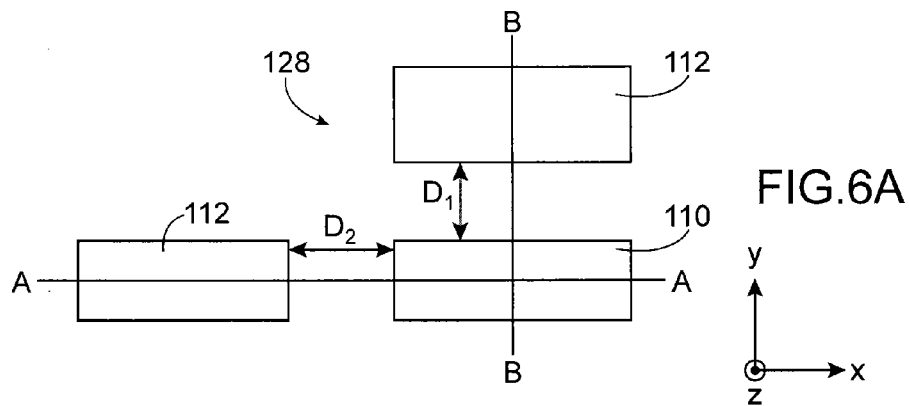
Figures 6B, 6C:
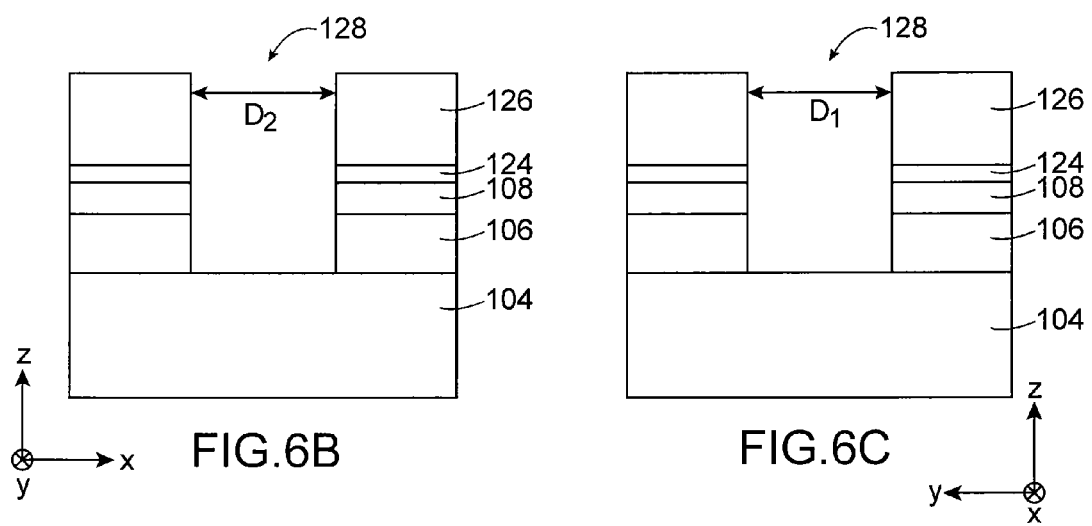

A trench 128, whose design is complementary to that of the active regions intended to be achieved in the substrate 102, is etched through the nitride layer 126, the oxide layer 124, the thin layer of semiconductor 108 and the thin dielectric layer 106 (but not through the thick layer 104). In the example of FIGS. 6A to 6C (FIGS. 6B and 6C are cross-sectional views respectively along the lines AA and BB shown in FIG. 6A), an active region 110 of the device 100, intended to form a channel, a source region and a drain region of the device 100, and corresponding to a region of the semiconductor thin layer 108, is spaced from other active regions 112 of a distance $D_1$ or $D_2$ between about 40 nm and 50 nm (for microelectronic devices made with 22 nm-node technology), corresponding to the width of the trench 128, or more generally between about 40 nm and 200 nm or even between 40 nm and 1 µm. The isolation trench 114 delimits the active region 110. This etching may correspond to an anisotropic etch with a stop at the level of the interface between the support layer 104 and the thin dielectric layer 106.

Figure 7A:
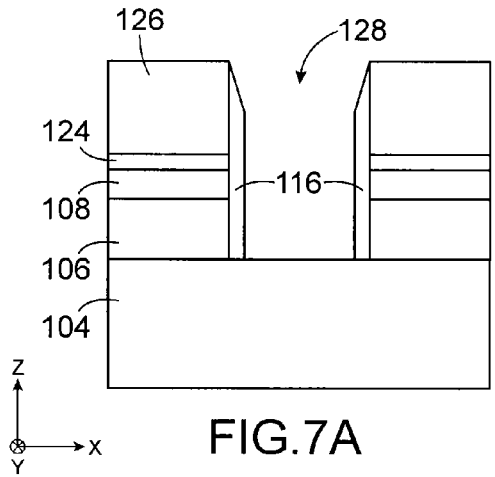
Figure 7B:
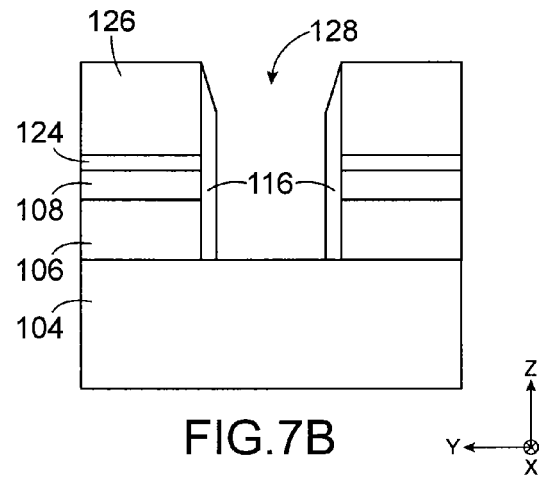

The side walls of the trench 128 are then protected with a dielectric layer 116 composed for example of nitride semiconductor, here SiN, and produced against the sidewalls of the trench 128 (see FIGS. 7A and 7B). The dielectric layer 116 is formed as a spacer around the remaining portions of the layers 126, 124, 108 and 106, that is against the side walls of the layers 126, 124, 108 and 106 located inside the trench 128. The thickness of the dielectric layer 116 may be between around 3 nm and 15 nm for microelectronic devices made with 22 nm-node technology. The maximum thickness of the dielectric layer 116 depends on distance $D_1$ or $D_2$ which has to be respected according to the technology node with which the device is made. The dielectric layer 116 is produced with a conformal deposition of the dielectric material (that is a deposition with a regular thickness against the sidewalls of the trench 128 and also against the bottom walls of the trench 128 and on the nitride layer 126). An anisotropic etching, e.g. a RIE (Reactive Ion Etching), is then carried out in order to etch the portions of the dielectric material previously formed against the bottom walls of the trench 128 and on the nitride layer 126, thus forming the dielectric layer 116 as a spacer around the portions of layers 126, 124, 108 and 106.

According to another embodiment, the dielectric layer 116 may comprise a bilayer of $SiN/SiO_2$, or a high-k dielectric (with a permittivity greater than about 3.9) such as $HfO_2$ or HfSiON.

Figure 8A:
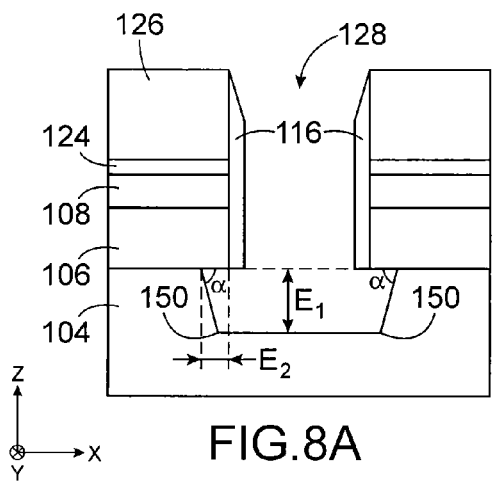
Figure 8B:
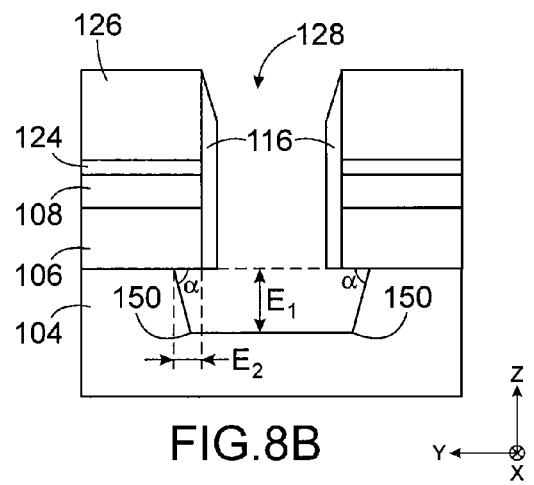

As shown in FIGS. 8A and 8B, a chemical vapor etching (CVE) is then carried out at the level of the bottom of the trench 128, through a part of the thickness of the monocrystalline semiconductor-based support layer 104. This etching is done using HCl as etching agent, at a temperature between about 600° C. and 950° C., and at high pressure, that is between about 10 Pa and $10^5$ Pa. This pressure corresponds to the partial pressure of the etching agent, for example HCl partial pressure. For example, it is possible to use HCl at a pressure of about 50 Pa with a temperature equal to about 850° C., or at a pressure of about 30000 Pa with a temperature equal to about 700° C. As the crystalline orientation of the monocrystalline semiconductor of the support layer 104 is {100} and the direction is <110>, such etching enables to etch both crystalline planes {100} and {111} of the support layer 104. The etching of the crystalline plane {100} correspond to a etching of the semiconductor perpendicularly to the main plane of the support layer 104, that etching direction being parallel to the axis Z shown in FIGS. 8A and 8B.

The etching according to the crystalline plane {100} correspond to an etching of a portion of the monocrystalline semiconductor of the support layer 104 with a thickness corresponding to the dimension $E_1$ shown in FIGS. 8A and 8B. In order to have an isolation trench deep enough to ensure a good electrical insulation in view of a possible shift of an electrical contact on the isolation trench, but also to have an isolation trench not too deep in order to have a electrical continuity between ground planes of two active zones one placed next to the other, the dimension $E_1$ may be less than or equal to around 40 nm. The etching according to the crystalline plane {111}, which forms with the crystalline plane {100} an angle α equal to around 54.7°, correspond to a etch of the portion of the monocrystalline semiconductor of the support layer 104 with a width equal to the sum of the initial width (dimension along axis X) of the trench 128 (that is $D_1$ or $D_2$) and of the dimension $E_2$ shown in FIGS. 8A and 8B. In order to have portions of the isolation trench (which will be formed later in the trench 128), the dimension $E_2$ may be between around 5 nm and 10 nm. With such dimension $E_2$, portions of dielectric material with a thickness between about 5 nm and 10 nm will be placed under the active region 110. With such dielectric portions located under the active region 110, the support layer 104 will form an effective ground plane under the active zone 110. Moreover, these dielectric portions will be in contact with the part of the dielectric layer 106 located under the active region 110.

The ratio between dimensions $E_1$ and $E_2$ is linked with the ratio between the etching rate of the crystalline plane {100}, called ER(100), and the etching rate of the crystalline plane {111}, called ER(111). Moreover, the ratio between ER(100) and ER(111) can be adjusted by setting the pressure, the temperature and the duration of the chemical vapor etching. For example, with ER(111)=ER(100), it is possible to obtain a trench 128 in which $E_1$=8 nm and $E_2$=10 nm, or in which $E_1$=4 nm and $E_2$=5 nm. By varying the temperature and/or the pressure and/or the duration of the chemical vapor etching step, it is possible to obtain ER(111)=0.8×ER(100). In this case, it is possible to have $E_1$=$E_2$, for example equal to 10 nm. By varying again the temperature and/or the pressure and/or the duration of this etching step, it is possible to obtain ER(111)=0.58×ER(100). In this case, it is possible to have $E_1$=7.3 nm and $E_2$=5 nm, or $E_1$=13.7 nm and $E_2$=10 nm. With such ratio between ER(100) and ER(111), the angle between crystalline planes {100} and {111} etched in the support layer 104 (referenced 150 in FIGS. 8A and 8B) can be aligned vertically with the side wall of the dielectric thin layer 106 (against which the dielectric layer 116 is formed). Thus, in a preferred embodiment, the ratio ER(111)/ER(100) is equal or greater than around 0.58.

For example, with a temperature of the HCl chemical vapor etching equal to around 850° C., a pressure equal to around 300 Pa and a duration of the etching comprises between around 15 seconds and 30 seconds, it is possible to obtain a ratio ER(111)/ER(100) comprised between around 0.38 and 0.67 (this variation depends on a ratio between an etched surface and a non-etched surface).

Figure 9A:
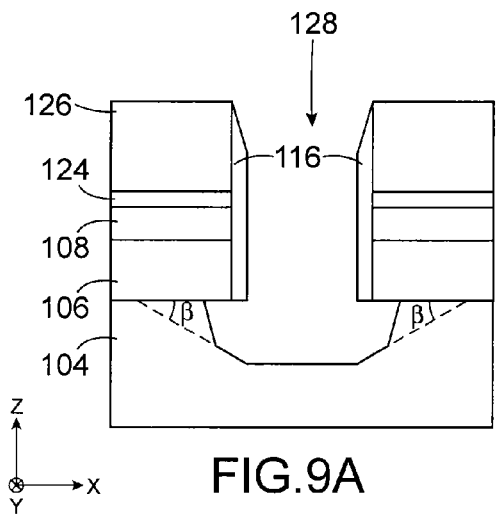
Figure 9B:
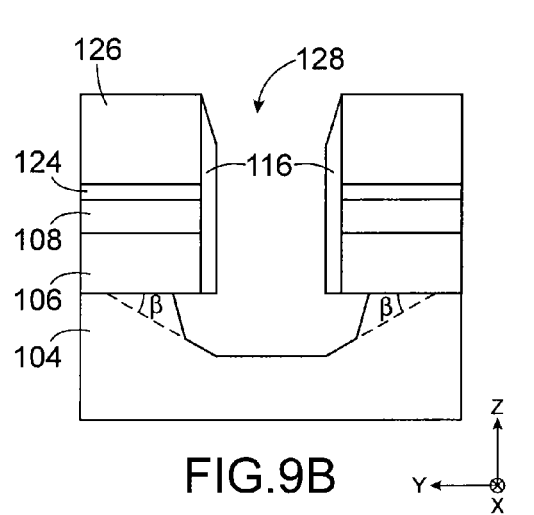
Figure 10A:
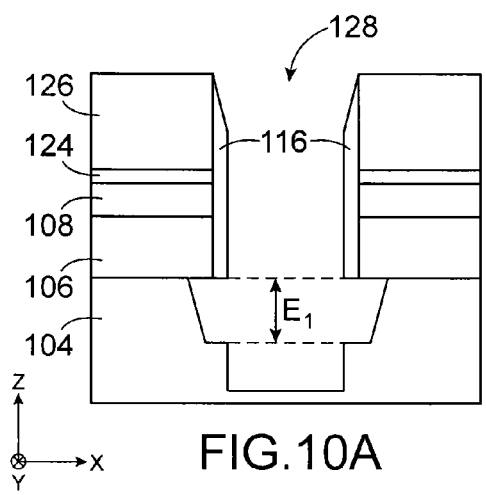
Figure 10B:
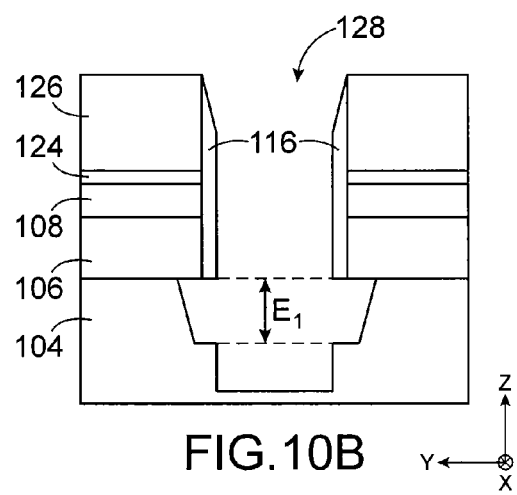
Figure 11A:
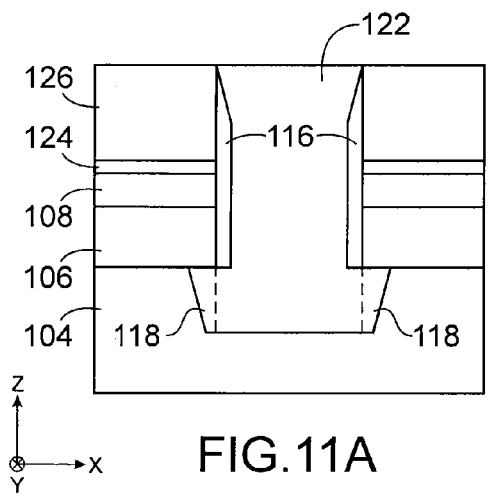
Figure 11B:
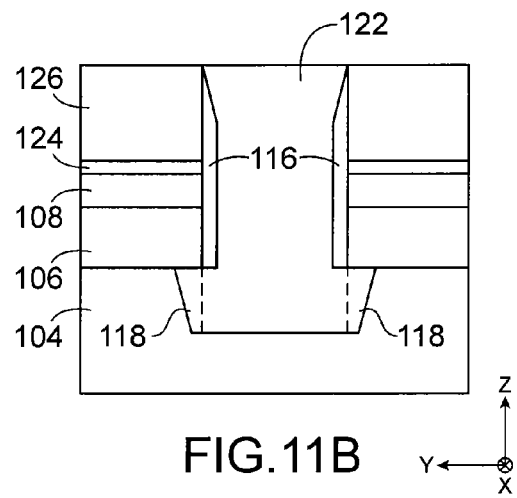

According to a variant shown in FIGS. 9A and 9B, the chemical vapor etching may be carried out at a temperature and at pressure such that this etching step enables to etch the crystalline planes {100} and {111}, but also the crystalline plane {311} of the monocrystalline semiconductor of the support layer 104 which have a crystalline orientation {100}. An angle β between the crystalline plane {311} and the crystalline plane {100} is equal to around 25°. Such variant may be obtained if the temperature is above around 850° C. and/or if the pressure is below around 1000 Pa. Is also possible to avoid such variant when the temperature is below 850° C. if the pressure is above 100 Pa.

As the etching rate of the crystalline plane {100} is linked with the etching rate of the crystalline plane {111} (and eventually with the etching rate of the crystalline plane {311}), it is possible to have a configuration in which the dimension $E_2$ is correct but in which the dimension $E_1$ is not enough. In this case, it is possible to obtain a deeper trench 128 with a further etching of the semiconductor of the support layer 104 at the level of the bottom of the trench 128 (see FIGS. 10A and 10B). Such etching is for example made through at least a part of the support layer 104 with an anisotropic etching step. However, such additional etching of the support layer 104 have the drawback to consume the nitride layer 126 (10 nm of the nitride layer 126 is consumed for each 40 nm of etched semiconductor of the layer 104). If needed, a complementary deeper STI can be made with no loss of nitride with a realization of an additional lithography aligned inside the trench so formed, such that the nitride is protected with resist. This is a way to process a dual-STI module for the UTBB technology.

The total depth of the trench 128 (through the layers 126, 124, 108, 106 and 104) is for example equal to around 200 nm, and may be between around 100 nm and 300 nm.

The dielectric layer 116 formed along the side walls of the trench 128, at the level of the layers 106, 108, 124 and 126 of the stack, protects these layers, especially the thin silicon layer 108, against the etching agent used during the chemical vapor etching of the support layer 104.

The making of the isolation trench is then achieved with the filling of the trench 128 with a dielectric material 122, e.g. $SiO_2$. The portions of dielectric material which are deposited outside of the trench are etched with a planarization like a CMP for example, the dielectric layer 126 serving as a stop layer during this planarization. This filling enables to obtain dielectric portions 118 symbolically shown in FIGS. 11A and 11B (symbolically because there is no physical difference or bound between the dielectric material of the portions 118 and the rest of the dielectric material 122 placed in the trench 128). The portions 118 correspond to the dielectric material which is formed under the active region 110 of the device 110 and also under the other active regions 112 around the active region 110.

The layers 124 and 126 are then removed in order to reveal the thin layer of semiconductor 108. The various components of the device 100 are then made above the thin layer of semiconductor 108 and in the active region 110 (gate dielectric, gate, creation of source and drain regions, etc.).

Figure 12:
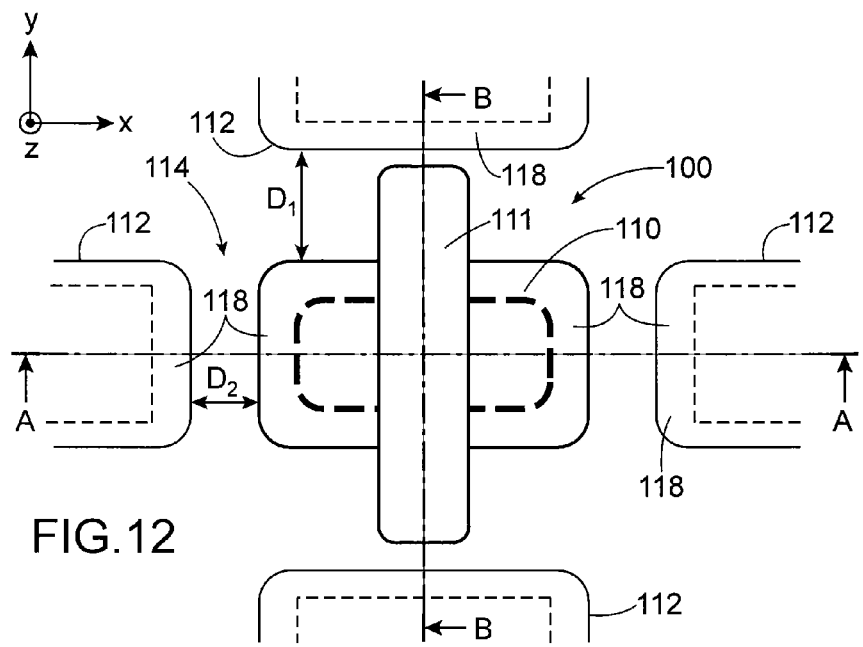
Figure 13:
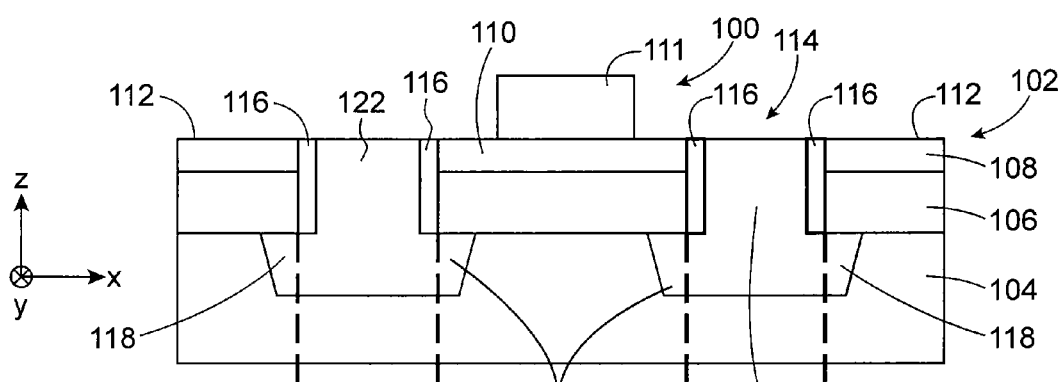
Figure 14:
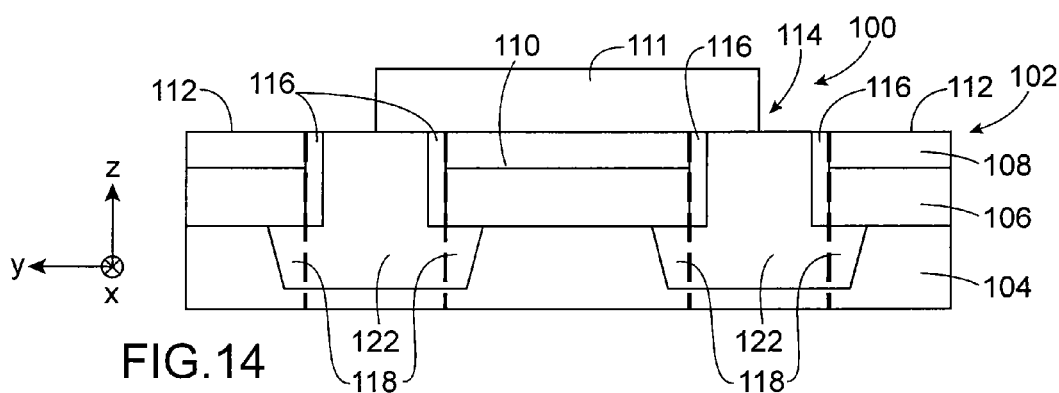

FIGS. 12-14 show schematically the microelectronic device 100 produced with the method above described. FIG. 12 is a top view of the device 100, and FIGS. 13 and 14 are cross-sectional views respectively along lines AA and BB shown in FIG. 12.

On top of the elements previously described, the device 100 also comprises a gate 111 formed on the active region 110. The active region 110 is isolated from the other active regions 112 by the isolation trench 114. At the level of the support layer 104, the side walls of the isolation trench 114 are formed by the portions 118 of dielectric material, here composed of $SiO_2$. The dielectric portions 118 have each a thickness (dimension along the X axis) between about 5 nm and 10 nm and form the side walls of the isolation trench 114 in the semiconductor support layer 104 under the active regions 110, 112. Thus the four side walls of the isolation trench 114 of device 100 all extend under the active region 110. The dielectric portions 118 are therefore present in the entire periphery of the active region 110. The portions 118 are in contact with the part of the dielectric layer 106 located under the active region 110. According to other embodiments, the thickness of the dielectric portions 118 may be between about 5 nm and 50 nm.

In the example above-described, the support layer 104 has a crystalline orientation {100} and a crystalline direction <110>, the process thus etching both crystalline planes, or facets, {100} and {111}, and eventually facet {311}. However, the above-described method may be carried out with a substrate comprising a support layer having a different crystalline orientation. For example, if the support layer 104 has a crystalline orientation {100} and a crystalline direction <100>, the process enables to etch the layer 104 according to the crystalline planes, or facets, {100} and {110} (in this case, the crystalline plane {110} may form with the crystalline plane {100} an angle α equal to around 90°. If the support layer 104 has a crystalline orientation {110} and a crystalline direction <110>, the process enables to etch the layer 104 according to the crystalline planes, or facets, {100} and {110} (in this case, the crystalline plane {100} may form with the crystalline plane {110} an angle α equal to around 45°. If the support layer 104 has a crystalline orientation {110} and a crystalline direction <100>, the process enables to etch the layer 104 according to the crystalline planes, or facets, {110} and {111} (in this case, the crystalline plane {111} may form with the crystalline plane {110} an angle α equal to around 35.4°.

The invention claimed is:

1. A method of producing a microelectronic device in a substrate including a first semiconductor layer disposed on a dielectric layer, the dielectric layer being disposed on a second semiconductor layer comprising at least a monocrystalline semiconductor, the method comprising:
   etching a trench through the first semiconductor layer and the dielectric layer such that a bottom wall of the trench is formed by a part of a top face of the second semiconductor layer which is in contact with the dielectric layer, and such that the trench delimits, in the first semiconductor layer, at least one active region of the microelectronic device;
   chemical vapor etching the second semiconductor layer, at a level of the bottom wall of the trench, according to at least two crystalline planes of the second semiconductor layer, one of the two crystalline planes corresponding to a crystalline orientation of the second semiconductor layer, such that an etched part of the second semiconductor layer extends under a part of the active region;
   filling the trench and the etched part of the second semiconductor layer with a dielectric material, forming an isolation trench surrounding the active region and including, at a level of the etched part of the second semiconductor layer, at least one portion of the dielectric material extending under a part of the active region.

2. The method according to claim 1, wherein the at least one portion of the dielectric material extending under the part of the active region is in contact with a portion of the dielectric layer disposed under the active region.

3. The method according to claim 1, wherein the chemical vapor etching is carried out using HCl or $Cl_2$ as an etching agent.

4. The method according to claim 1, wherein the crystalline orientation of the second semiconductor layer is {100}, and wherein the other of the two etched crystalline planes is {111}.

5. The method according to claim 4, wherein the chemical vapor etching is carried out such that a ratio between an etching rate of the crystalline plane {111} and an etching rate of the crystalline plane {100} is equal or greater than 0.58.

6. The method according to claim 4, wherein the chemical vapor etching also etches the crystalline plane {311} of the second semiconductor layer.

7. The method according to claim 1, wherein the first semiconductor layer comprises a monocrystalline semiconductor.

8. The method according to claim 1, wherein the chemical vapor etching is carried out at a temperature between about 600° C. and 950° C., at a pressure between about 10 Pa and $10^5$ Pa, and during a period between about 1 second and 10000 seconds.

9. The method according to claim 1, further comprising, between the etching the trench through the first semiconductor layer and the dielectric layer, and the chemical vapor etching of the second semiconductor layer, producing at least one dielectric layer forming side walls of the trench against the dielectric layer and the first semiconductor layer.

10. The method according to claim 1, wherein the active region is rectangular in shape and delimited by side walls of the isolation trench extending through the first semiconductor layer, the dielectric layer, and a part of the thickness of the second semiconductor layer, and wherein, at a level of the part of the thickness of the second semiconductor layer, the side walls of the isolation trench are formed by the at least one portion of the dielectric material extending under the part of the active region.

11. The method according to claim 1, further comprising, between the chemical vapor etching of the second semiconductor layer and the filling the trench and the etched part of the second semiconductor layer with a dielectric material, etching a second part of the second semiconductor layer, extending the trench deeper in the second semiconductor layer.

12. The method according to claim 1, further comprising, after the filling the trench and the etched part of the second semiconductor layer with a dielectric material, producing at least one transistor in the active region, the transistor including a gate made on a part of the active region.

* * * * *